United States Patent [19]

Moyer et al.

[11] Patent Number: 4,803,540
[45] Date of Patent: Feb. 7, 1989

[54] SEMICONDUCTOR INTEGRATED CIRCUIT PACKAGES

[75] Inventors: Harold W. Moyer, South Whitehall Township, Lehigh County; Harry R. Scholz, Lower Macungie Township, Lehigh County, both of Pa.

[73] Assignee: American Telephone and Telegraph Co., AT&T Bell Labs, Murray Hill, N.J.

[21] Appl. No.: 934,062

[22] Filed: Nov. 24, 1986

[51] Int. Cl.$^4$ ............................................. H01L 23/48
[52] U.S. Cl. .......................................... 357/70; 357/69
[58] Field of Search ...................................... 357/70, 69

[56] References Cited

U.S. PATENT DOCUMENTS 4,289,922  9/1981  Devlin .................................... 357/70
4,477,827 10/1984  Walker et al. ......................... 357/70

FOREIGN PATENT DOCUMENTS 52-12573  1/1977  Japan ..................................... 357/70
57-66655  4/1982  Japan ..................................... 357/70
2027990   2/1980  United Kingdom ................. 357/70

Primary Examiner—Martin H. Edlow
Assistant Examiner—Gregory A. Key
Attorney, Agent, or Firm—Richard D. Laumann; James H. Fox

[57] ABSTRACT

A lead frame for mounting a semiconductor chip in an integrated circuit package incorporates a deformation absorbing member as an integral part of the paddle support arm so that the initial, desired physical and electrical characteristics are unaltered after a forming operation such as paddle downsetting.

5 Claims, 3 Drawing Sheets

A-A'

SEMICONDUCTOR INTEGRATED CIRCUIT PACKAGES

TECHNICAL FIELD

This invention relates generally to packages for semiconductor integrated circuits.

BACKGROUND OF THE INVENTION

An essential part of semiconductor integrated circuit manufacture resides in the placing of the integrated circuit chip into a package so that the chip can be conveniently contacted electrically as well as mounted in a physically secure manner. The chip itself is mounted on a lead frame which has a plurality of fingers for electrical connections and a paddle for physical support. The paddle is connected physically to an external mounting frame by paddle support arms. Electrical contacts are made through wires bonded to the fingers and to the paddle.

Although the package could be assembled using a lead frame in which the paddle remains in the same plane as do the fingers, it has often been found desirable to assemble a package using a lead frame in which the paddle has been depressed, i.e., made lower, with respect to the external mounting frame and fingers. It has been found that this configuration reduces the number of edge shorts between the electrical contact wires and the chip. It also allows a balanced flow condition during molding. As will be readily appreciated by those skilled in the art, the depressed positioning will necessarily lead to a physical deformation of the paddle support arms during the forming process because the lead frame is initially a flat metal piece. The deformation will generally be in the form of a necking down, i.e., a constriction of paddle support arms in the transverse axial direction.

As feature sizes in integrated circuits continue to decrease and the scale of integration continues to increase, package designers must make more interconnects in an amount of space that is, at best, equal to that previously available. The only expedient way this may be accomplished is to decrease the width of the fingers and paddle support arms to permit placement of more fingers in either the same or a smaller area. Consequently, the combined effect of the constriction and decreased feature size may lead to problems such as loss of physical integrity and distortion of the paddle support arms. If these arms are also used for electrical connections, there may be undesirable changes in the electrical characteristics as well.

SUMMARY OF THE INVENTION

A semiconductor integrated circuit package is described which as a semiconductor integrated circuit chip and a lead frame, on which said chip is mounted, having a plurality of fingers, a paddle and a plurality of paddle support arms with the paddle support arms having a deformation absorbing member. The lead frame is formed so that the paddle is in a depressed position with respect to the external mounting frame. The deformation absorbing member is designed to maintain the desired mechanical characteristics after forming. It may also retain the desired electrical characteristics if the arms are used for electrical connections. In one embodiment, the deformation absorbing member is an annular member which contracts in a direction transverse to the load direction. In another embodiment, the deformation absorbing member is a T bar. The paddle is supported by the paddle support arms which terminate in a T before contacting the external mounting frame. The legs of the T. perpendicular to the paddle support arm axis, are designed to deflect and absorb the deformation that results from the metal forming process of depressing the paddle. In all embodiments, the deformation absorbing member localizes the deformation which occurs during the mounting step producing the deformation.

For reasons of clarity, the elements of the devices depicted are not drawn to scale.

DETAILED DESCRIPTION

Figure 1:
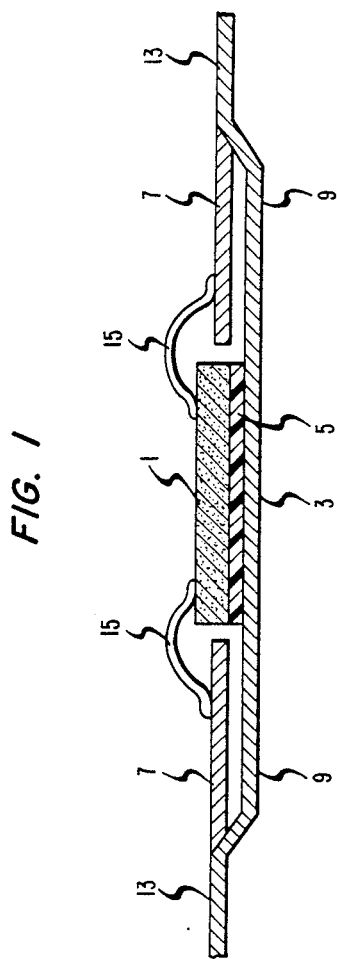
FIG. 1 is a side view of a package according to the invention.

A side view of an exemplary integrated circuit package is depicted in FIG. 1. Depicted are semiconductor chip 1 which is mounted on paddle 3 by means of epoxy material 5. Paddle 3 is part of the lead frame which also has a plurality of fingers 7 and paddle support arms 9 for physical support. The fingers 7 are connected to the external mounting frame 13. There are electrical connections 15 between the chip and the fingers 7. As can be seen, the paddle 3 is positioned lower than the external mounting frame 13 because the paddle support arms have been deformed. This arrangement is desirable because it facilitates making, e.g., the electrical connections as previously discussed. The paddle support arms are bent to accommodate the vertical mismatch and each has a deformation absorbing member which localizes the deformation to the vicinity of that member.

Figure 2:
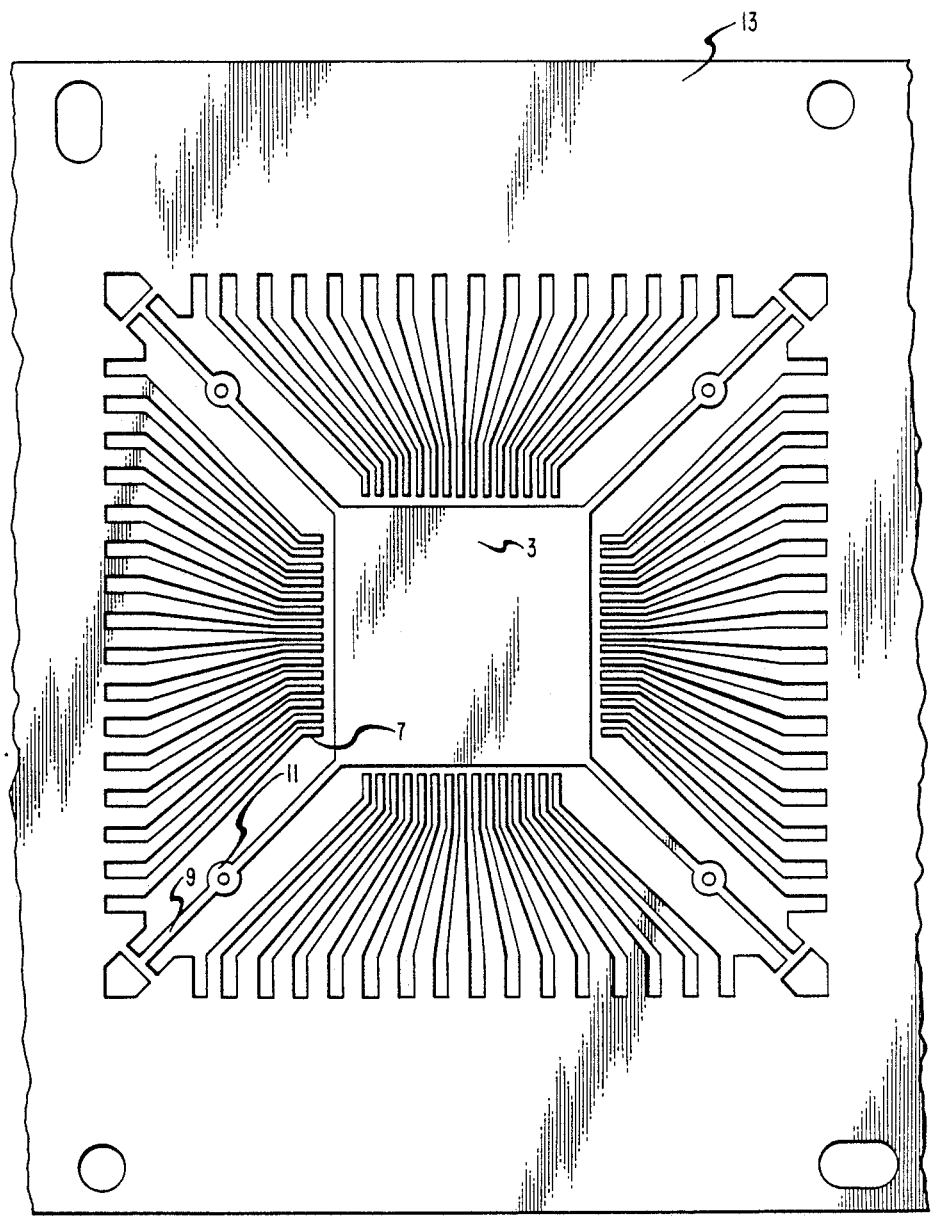
FIG. 2 is a top view of an embodiment of this invention.

FIG. 2 is a top view of the single site depicted in FIG. 1 of a typical lead frame. Depicted are a lead frame site comprising an external mounting frame 13, a paddle 3, a plurality of fingers 7, and a plurality of paddle support arms 9 extending from the paddle. Each paddle support arm has a deformation absorbing member 11. For reasons of clarity, not all fingers are depicted. In the embodiment depicted in FIG. 2, the deformation absorbing member 11 comprises an annular member, i.e., a member with expanded dimensions in the direction perpendicular to the major axis of the paddle support arm. The annular member is depicted as being circular although other shapes, e.g., oval, can be used.

During the forming operation, i.e., as the paddle is depressed with respect to the external mounting frame, the deformation absorbing member constricts in the direction perpendicular to the axis of motion. However, due to the size and shape of the deformation absorbing member, the desired electrical and physical characteristics are maintained after the forming operation as the paddle support arm does not form a necked down region. Thus, it is essential that the deformation absorbing member compensate for the axial motion along the paddle support arm. Further steps required for packaging need not be described in detail as they are well known to those skilled in the art.

Figure 3:
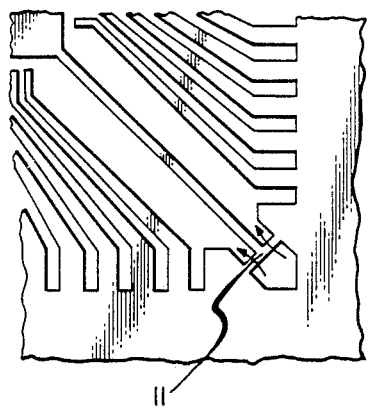
FIG. 3 is a top view of another embodiment of this invention.

FIG. 3 illustrates another embodiment of a paddle support arm 11 having a deformation absorbing member which comprises a T bar with the two ends of the T mounted to the external mounting frame. During the forming operation, the paddle support arms move radially inward causing the ends of the T to deflect about the mounting axis in the direction shown by the arrows.

Figure 4:
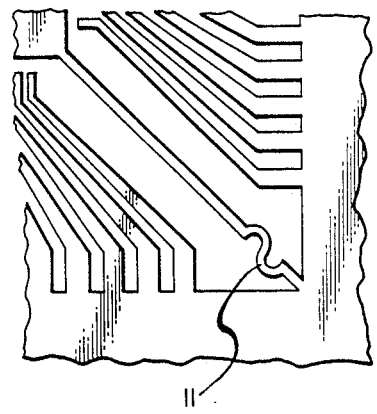
FIGS. 4 and 5 illustrate still other embodiments of this invention.
Figure 5:
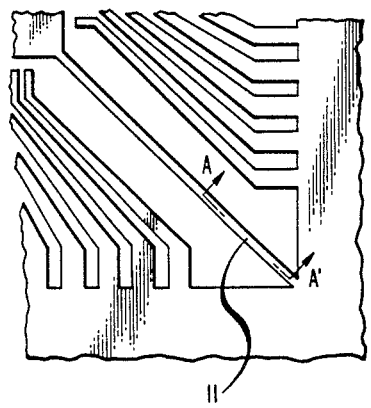
Figure 6:
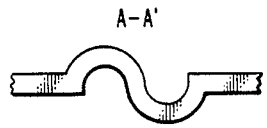
FIG. 6 illustrates the embodiment shown in FIG. 5 along line A-A'.

Other embodiments are contemplated, and two embodiments are depicted in FIGS. 4 and 5. In FIG. 4 the deformation absorbing member comprises an S bend while in FIG. 5 it comprises a wrinkle. FIG. 6 shows the wrinkle along line A-A' in FIG. 5.

What is claimed is:

1. A semiconductor integrated circuit package comprising: a semiconductor integrated circuit chip; a lead frame, said lead frame having a paddle on which said chip is mounted and paddle support arms; and an external mounting frame having a plurality of fingers, electrical connections from said chip to said fingers, said paddle being connected to said external mounting frame by said paddle support arms CHARACTERIZED IN THAT said paddle support arms comprise a deformation absorbing member, said paddle being depressed with respect to said external mounting frame, said deformation absorbing member localizing deformation during paddle downsetting and maintaining desired physical characteristics.

2. A package as recited in claim 1 in which said deformation absorbing member comprises a T bar.

3. A package as recited in claim 1 in which said deformation absorbing member comprises an S bend member.

4. A package as recited in claim 1 in which said deformation absorbing member comprises an annular member.

5. A package as recited in claim 1 in which said deformation absorbing member comprises a wrinkle member.

* * * * *